(12) United States Patent
Lee et al.

(10) Patent No.: US 9,960,216 B2
(45) Date of Patent: May 1, 2018

(54) ORGANIC LIGHT EMITTING DISPLAY APPARATUS

(71) Applicant: LG Display Co., Ltd., Seoul (KR)

(72) Inventors: Joonsuk Lee, Seoul (KR); Se June Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 14/983,899

(22) Filed: Dec. 30, 2015

(65) Prior Publication Data

US 2016/0351636 A1   Dec. 1, 2016

(30) Foreign Application Priority Data

May 29, 2015   (KR) ........................ 10-2015-0076678

(51) Int. Cl.
  *H01L 23/528*   (2006.01)
  *H01L 27/32*    (2006.01)
  *H01L 51/52*    (2006.01)

(52) U.S. Cl.
  CPC ...... *H01L 27/3246* (2013.01); *H01L 27/3276* (2013.01); *H01L 51/5212* (2013.01); *H01L 51/5228* (2013.01); *H01L 2251/5315* (2013.01)

(58) Field of Classification Search
  CPC ............ H01L 27/3246; H01L 51/5228; H01L 2251/5315; H01L 27/3279; H01L 51/5203; H01L 27/3248; H01L 51/5212; H01L 21/76879; H01L 23/528; H01L 27/1248; H01L 27/3262; H01L 27/329; H01L 51/5271; H01L 51/5012; H01L 51/5225; H01L 29/41733; H01L 51/5221
  See application file for complete search history.

(56) References Cited

U.S. PATENT DOCUMENTS

| 2007/0194307 A1* | 8/2007 | Kim ................... H01L 27/3246 257/40 |
| 2009/0009069 A1* | 1/2009 | Takata ............... H01L 27/3246 313/504 |
| 2013/0056784 A1 | 3/2013 | Lee et al. |

(Continued)

FOREIGN PATENT DOCUMENTS

EP   2 827 371 A1   1/2015

*Primary Examiner* — Eliseo Ramos Feliciano
*Assistant Examiner* — Joannie A Garcia
(74) *Attorney, Agent, or Firm* — Morgan, Lewis & Bockius LLP

(57) ABSTRACT

An organic light emitting display apparatus includes a substrate; an anode electrode on the substrate; an auxiliary electrode on the substrate; an organic emission layer on the anode electrode; a cathode electrode on the organic emission layer and on the auxiliary electrode; an insulating bank on the auxiliary electrode, the bank overlapping a first portion of the auxiliary electrode and exposing a second portion of the auxiliary electrode; a first partition wall on the auxiliary electrode; a second partition wall on the first partition wall and covering the exposed second portion of the auxiliary electrode in plan view. A separation space is between the second partition wall and the bank, the cathode electrode is electrically connected to the auxiliary electrode through the separation space between the second partition wall and the bank, and the second partition wall is supported by the first partition wall and the bank.

13 Claims, 6 Drawing Sheets

(56) References Cited

U.S. PATENT DOCUMENTS

| | | | |
|---|---|---|---|
| 2013/0069067 A1* | 3/2013 | Youn | H01L 27/3246 257/59 |
| 2013/0099218 A1 | 4/2013 | Lee et al. | |
| 2015/0001507 A1* | 1/2015 | Kim | H01L 27/3246 257/40 |
| 2015/0188077 A1* | 7/2015 | Kim | H01L 51/5203 257/40 |
| 2016/0149156 A1* | 5/2016 | Kim | H01L 51/5228 257/40 |

* cited by examiner

ORGANIC LIGHT EMITTING DISPLAY APPARATUS

CROSS-REFERENCE TO RELATED APPLICATIONS

This application claims the benefit of the Korean Patent Application No. 10-2015-0076678, filed on May 29, 2015, which is hereby incorporated by reference as if fully set forth herein.

BACKGROUND

Field of the Disclosure

The present disclosure relates to an organic light emitting display apparatus, and more particularly, to a top emission type organic light emitting display apparatus.

Discussion of the Related Art

Organic light emitting display apparatuses are self-emitting apparatuses and typically have low power consumption, a fast response time, high emission efficiency, high luminance, and a wide viewing angle.

The organic light emitting display apparatuses are typically classified into a top emission type and a bottom emission type, based on a transmission direction of light emitted from an organic light emitting device. In the bottom emission type, a circuit element is disposed between an emission layer and an image displaying surface, and for this reason, an aperture ratio is lowered. On the other hand, in the top emission type, the circuit element is not disposed between the emission layer and the image displaying surface, and thus, an aperture ratio is enhanced.

FIG. 1 is a cross-sectional view of a related art top emission type organic light emitting display apparatus.

As seen in FIG. 1, a thin film transistor (TFT) T, which includes an active layer 11, a gate insulation layer 12, a gate electrode 13, an interlayer dielectric 14, a source electrode 15, and a drain electrode 16, is formed on a substrate 10, and a passivation layer 20 and a planarization layer 30 are sequentially formed on the TFT T.

An anode electrode 40 and an auxiliary electrode 50 are formed on the planarization layer 30. The auxiliary electrode 50 decreases a resistance of a cathode electrode 80 as will be described below.

A bank 60 is formed on the anode electrode 40 and the auxiliary electrode 50 and defines a pixel area by its absence. An organic emission layer 70 is formed in the pixel area defined by the bank 60, and the cathode electrode 80 is formed on the organic emission layer 70.

In the top emission type, light emitted from the organic emission layer 70 passes through the cathode electrode 80 and travels. Therefore, the cathode electrode 80 is formed of a transparent conductive material, but for this reason, a resistance of the cathode electrode 80 typically is increased. To decrease the resistance of the cathode electrode 80, the cathode electrode 80 is connected to the auxiliary electrode 50.

The related art top emission type organic light emitting display apparatus may have at least the following problems.

The related art organic light emitting display apparatus is an organic light emitting display apparatus to which a top emission type is applied, and has a drawback where it is difficult to deposit the organic emission layer 70. For example, in the related art organic light emitting display apparatus, an additional process may be needed to deposit the organic emission layer 70 on only the anode electrode 40. Also, in a case of blanket-depositing the organic emission layer 70, the auxiliary electrode 50 cannot be connected to the cathode electrode 80. Furthermore, because the organic emission layer 70 is not patterned to be separated in each of a plurality of pixels, defective driving can occur.

SUMMARY

Accordingly, the present disclosure is directed to providing an organic light emitting display apparatus that substantially obviates one or more problems due to limitations and disadvantages of the related art.

To achieve these and other advantages and in accordance with the purpose of the invention, as embodied and broadly described herein, there is provided an organic light emitting display apparatus, comprising a substrate; an anode electrode on the substrate; an auxiliary electrode on the substrate; an organic emission layer on the anode electrode; a cathode electrode on the organic emission layer and on the auxiliary electrode; an insulating bank on the auxiliary electrode, the bank overlapping a first portion of the auxiliary electrode and exposing a second portion of the auxiliary electrode; a first partition wall on the auxiliary electrode; a second partition wall on the first partition wall and covering the exposed second portion of the auxiliary electrode in plan view, wherein a separation space is between the second partition wall and the bank; the cathode electrode is electrically connected to the auxiliary electrode through the separation space between the second partition wall and the bank; and the second partition wall is supported by the first partition wall and the bank.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of embodiments of the invention. In the drawings.

DETAILED DESCRIPTION OF THE ILLUSTRATED INVENTION

Figure 1:
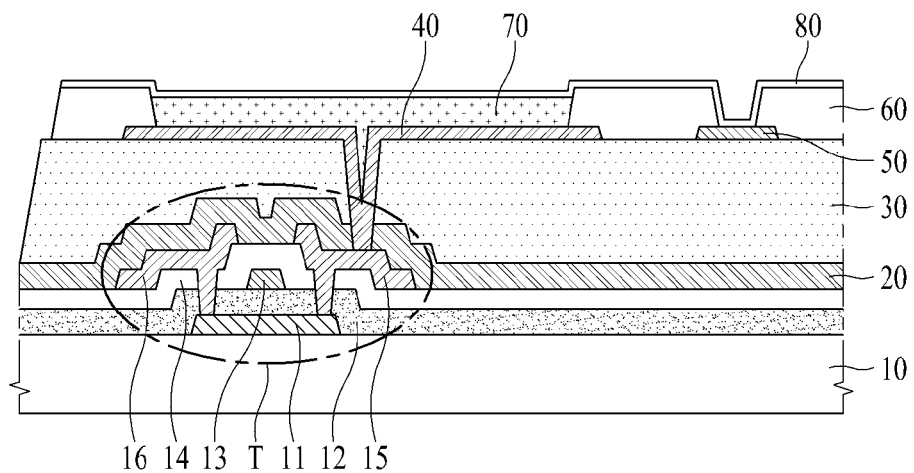
FIG. 1 is a cross-sectional view of a related art top emission type organic light emitting display apparatus.

Reference will now be made in detail to example embodiments of the present invention, examples of which are illustrated in the accompanying drawings. Where possible, the same reference numbers may be used throughout the drawings to refer to the same or like parts.

Advantages and features of embodiments of the present invention, and implementation methods thereof, will be described through the following with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A shape, a size, a ratio, an angle, and a number disclosed in the drawings for describing embodiments of the present invention are merely an example, and thus, the present invention is not limited to the illustrated details. In the following description, when the detailed description of the relevant known function or configuration is determined to unnecessarily obscure the disclosure, detailed description may be omitted.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, example embodiments of the present invention will be described in detail with reference to the accompanying drawings.

Figure 2:
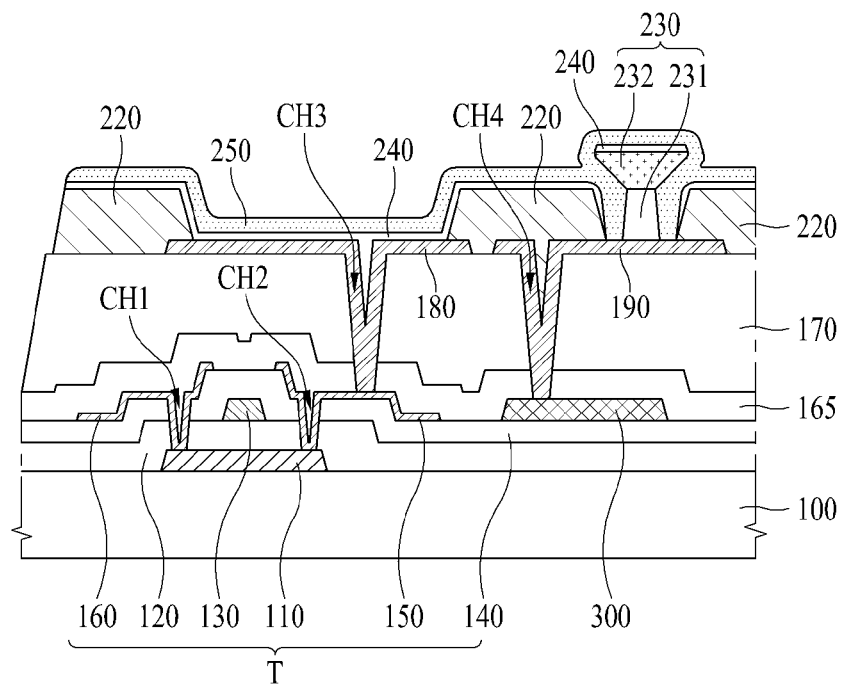
FIG. 2 is a cross-sectional view of an organic light emitting display apparatus according to an example embodiment of the present invention.

FIG. 2 is a cross-sectional view of an organic light emitting display apparatus according to an example embodiment of the present invention.

As seen in FIG. 2, a thin film transistor (TFT) T, an auxiliary line 300, a passivation layer 165, a planarization layer 170, an anode electrode 180, an auxiliary electrode 190, a bank 220, a partition wall 230, an organic emission layer 240, and a cathode electrode 250 may be formed on a substrate 100.

The TFT T may include an active layer 110, a gate insulation layer 120, a gate electrode 130, an interlayer dielectric 140, a source electrode 150, and a drain electrode 160.

The active layer 110 may be formed on the substrate 100. The active layer 110 may be formed of a silicon-based semiconductor material, or may be formed of an oxide-based semiconductor material. Although not shown, a light shielding layer may be further formed between the substrate 100 and the active layer 110, and in this case, external light incident through a bottom of the substrate 100 is blocked by the light shielding layer, thereby preventing the active layer 110 from being damaged by external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer formed of one of molybdenum (Mo), aluminum (Al), chromium (Cr), gold (Au), titanium (Ti), nickel (Ni), neodymium (Nd), copper (Cu), or an alloy thereof, but is not limited thereto.

The interlayer dielectric 140 may be formed on the gate electrode 130. The interlayer dielectric 140 may be formed of the same inorganic insulating material as that of the gate insulation layer 120, for example, silicon oxide (SiOx), silicon nitride (SiNx), or a multilayer thereof, but is not limited thereto.

The source electrode 150 and the drain electrode 160 may be formed to face each other on the interlayer dielectric 140. A first contact hole CH1 exposing one end region of the active layer 110 and a second contact hole CH2 exposing the other end region of the active layer 110 may be included in the gate insulation layer 120 and the interlayer dielectric 140. The source electrode 150 may be connected to the other end region of the active layer 110 through the second contact hole CH2, and the drain electrode 160 may be connected to the one end region of the active layer 110 through the first contact hole CH1.

A structure of the TFT T is not limited to the illustrated structure, and may be variously modified to structures known to those skilled in the art. For example, a top gate structure where the gate electrode 130 is formed on the active layer 110 is illustrated in the drawing, but the TFT T may be formed in a bottom gate structure where the gate electrode 130 is formed under the active layer 110.

The auxiliary line 300 may be disposed on the same layer as a layer on which the source electrode 150 and the drain electrode 160 are disposed (e.g., on interlayer dielectric 140), and may be disposed to be separated from the source electrode 150 and the drain electrode 160. The auxiliary line 300 may be formed through the same process simultaneously with the source electrode 150 and the drain electrode 160, and may be formed of the same material as that of the source electrode 150 and the drain electrode 160. The auxiliary line 300 may be connected to the below-described auxiliary electrode 190 through a fourth contact hole CH4. Because the auxiliary line 300 is connected to the auxiliary electrode 190 through the fourth contact hole CH4, resistances of the auxiliary electrode 190 and the cathode electrode 250 may be lowered.

The passivation layer 165 may be formed on the TFT T, and in more detail, may be formed on tops of the source electrode 150, the drain electrode 160, and the auxiliary line 300. The passivation layer 165 protects the TFT T. The passivation layer 165 may be formed of an inorganic insulating material (for example, SiOx and SiNx), but is not limited thereto.

The planarization layer 170 may be formed on the passivation layer 165. The planarization layer 170 may planarize an upper surface of the substrate 100 including the TFT T. The planarization layer 170 may be formed of an organic insulating material such as acryl resin, epoxy resin, phenolic resin, polyamide resin, polyimide resin, or the like, but is not limited thereto.

The anode electrode 180 and the auxiliary electrode 190 may be formed on the planarization layer 170. That is, the anode electrode 180 and the auxiliary electrode 190 may be formed on the same layer. A third contact hole CH3 exposing the source electrode 150 may be included in the passivation layer 165 and the planarization layer 170, and the source electrode 150 may be connected to the anode electrode 180 through the third contact hole CH3. Also, the fourth contact hole CH4 exposing the auxiliary line 300 may be included in the passivation layer 165 and the planarization layer 170, and the auxiliary line 300 may be connected to the auxiliary electrode 190 through the fourth contact hole CH4.

The bank 220 may be formed on the anode electrode 180 and the auxiliary electrode 190. The bank 220 may be formed on one side and the other side of the anode electrode 180 (e.g., opposite sides) to leave tops of the anode electrode 180 and the auxiliary electrode 190 exposed, and to cover side surfaces of the anode electrode 180 and the auxiliary electrode 190. Because the bank 220 is formed to expose the top of the anode electrode 180, an area where an image is displayed is secured. Also, because the bank 220 is formed to expose the tops of the anode electrode 180 and the auxiliary electrode 190, an electrical connection space between the auxiliary electrode 190 and the cathode electrode 250 is made available.

Moreover, the bank 220 may be formed between the anode electrode 180 and the auxiliary electrode 190, and may insulate the anode electrode 180 from the auxiliary electrode 190. The bank 220 may be formed of an organic insulating material such as polyimide resin, acryl resin, benzocyclobutene (BCB), or the like, but is not limited thereto.

The partition wall 230 may be formed on the auxiliary electrode 190. The partition wall 230 may be separated from the bank 220 by a certain distance, and the auxiliary electrode 190 may be electrically connected to the cathode electrode 250 through a separation space between the partition wall 230 and the bank 220.

In a related art organic light emitting display apparatus, an auxiliary electrode is electrically connected to a cathode electrode without forming a partition wall. On the other hand, according to an example embodiment of the present invention, the partition wall 230 is formed, and thus, the organic emission layer 240 is more easily deposited. This will be described below in detail.

If the partition wall 230 is not formed, a mask pattern, which covers a top of the auxiliary electrode 190, is needed in depositing the organic emission layer 240, in order for the top of the auxiliary electrode 190 not to be covered by the organic emission layer 240. However, if the partition wall 230 is formed, a top of the partition wall 230 may act as eaves in depositing the organic emission layer 240. Thus, because the organic emission layer 240 is not deposited under the eaves, the mask pattern which covers the top of the auxiliary electrode 190 is not needed. That is, with respect to a case where the organic light emitting display apparatus is seen from the front thereof, when the top of the partition wall 230 that acts as eaves is formed to cover a separation space between the partition wall 230 and the bank 220, the organic emission layer 240 may not penetrate into the separation space between the partition wall 230 and the bank 220, and thus, the auxiliary electrode 190 may be exposed in the separation space between the partition wall 230 and the bank 220. For example, the organic emission layer 240 may be formed by a deposition process, such as an evaporation process, which is excellent in straightness of a deposited material, and thus, the organic emission layer 240 cannot be deposited in the separation space between the partition wall 230 and the bank 220.

As described above, a width of the top of the partition wall 230 may be formed greater than that of a bottom of the partition wall 230, in order for the top of the partition wall 230 to act as the eaves. The partition wall 230 may include a lower first partition wall 231 and an upper second partition wall 232. The first partition wall 231 may be formed on a top of the auxiliary electrode 190 and may be formed of the same material as that of the bank 220 through the same process as that of the bank 220. The second partition wall 232 may be formed on a top of the first partition wall 231. A width of a top of the second partition wall 232 may be formed greater than that of a bottom of the second partition wall 232, and particularly, the top of the second partition wall 232 may be formed to cover the separation space between the partition wall 230 and the bank 220 and may act as eaves.

In this case, the first partition wall 231 may be formed not to overlap the fourth contact hole CH4 that connects the auxiliary electrode 190 to the auxiliary line 300. When the fourth contact hole CH4 and the first partition wall 231 are formed to overlap each other, the auxiliary electrode 190 formed under the first partition wall 231 may not uniformly be formed due to the fourth contact hole CH4, and for this reason, the first partition wall 231 may not be uniformly formed. When the first partition wall 231 is not uniformly formed, the second partition wall 232 formed on the first partition wall 231 may be inclined, and the organic emission layer 240 may be formed on the auxiliary electrode 190, thereby causing a defect where the cathode electrode 250 may not be connected to the auxiliary electrode 190.

The organic emission layer 240 may be formed on the anode electrode 180. The organic emission layer 240 may include a hole injection layer, a hole transport layer, an emission layer, an electron transport layer, and an electron injection layer. The organic emission layer 240 may be modified to have various structures known to those skilled in the art.

The organic emission layer 240 may extend to the top of the bank 220. However, the organic emission layer 240 may not extend to the top of the auxiliary electrode 190 and cover the top of the auxiliary electrode 190. This is because when the organic emission layer 240 covers the top of the auxiliary electrode 190, it may be difficult to electrically connect the auxiliary electrode 190 to the cathode electrode 250. As described above, the organic emission layer 240 may be formed by a deposition process without a mask that covers the top of the auxiliary electrode 190, and in this case, the organic emission layer 240 may be formed on the top of the partition wall 230.

The cathode electrode 250 may be formed on the organic emission layer 240. The cathode electrode 250 may be formed on a surface from which light is emitted, and thus may be formed of a transparent conductive material. Because the cathode electrode 250 is formed of a transparent conductive material, a resistance of the cathode electrode 250 is high, and for this reason, in order to lower the resistance of the cathode electrode 250, the cathode electrode 250 may be connected to the auxiliary electrode 190. That is, the cathode electrode 250 may be connected to the auxiliary electrode 190 through the separation space between the partition wall 230 and the bank 220. The cathode electrode 250 may be formed by a deposition process, such as a sputtering process, which is not good in straightness of a deposited material. Thus, the cathode electrode 250 may be deposited in the separation space between the partition wall 230 and the bank 220 in a process of depositing the cathode electrode 250.

Although not shown, an encapsulation layer may be further formed on the cathode electrode 250 and prevents penetration of water. The encapsulation layer may use various materials known to those skilled in the art. Also, although not shown, a color filter may be further formed for each pixel and on the cathode electrode 250, and in this case, white light may be emitted from the organic emission layer 240.

Figure 3:
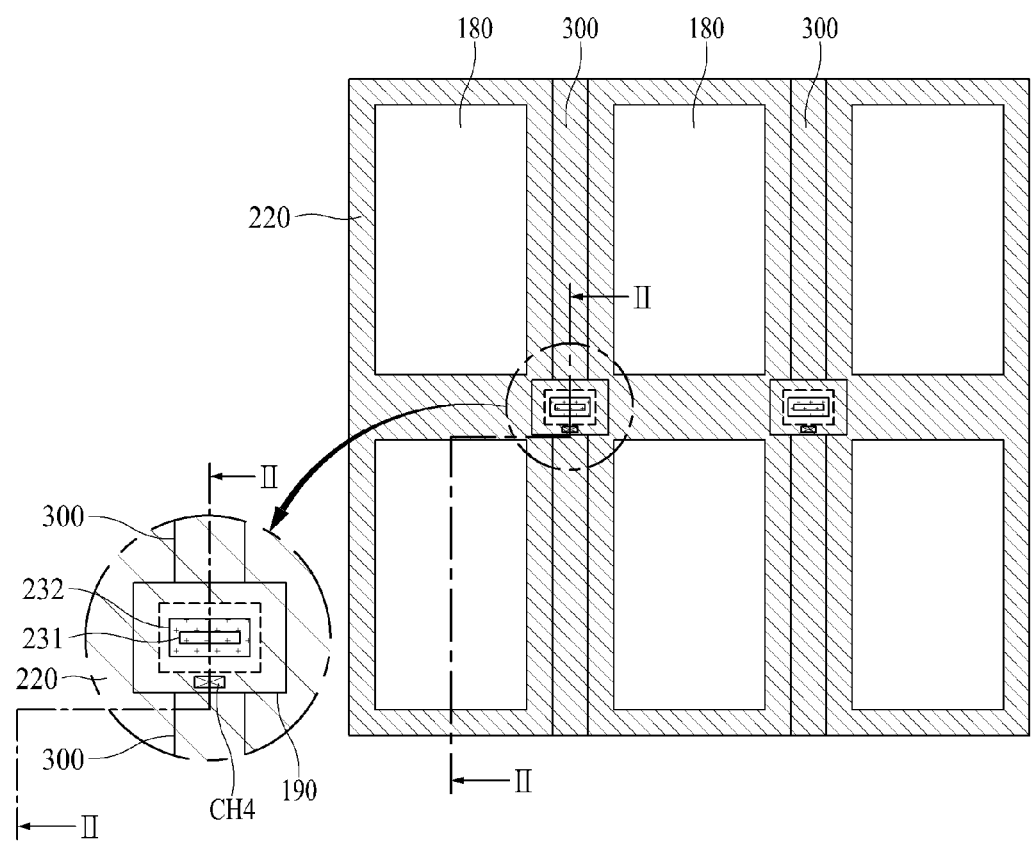
FIG. 3 is a plan view of an organic light emitting display apparatus according to an example embodiment of the present invention.

FIG. 3 is a plan view of an organic light emitting display apparatus according to an example embodiment of the present invention.

FIG. 3 illustrates a plan view of the above-described organic light emitting display apparatus of FIG. 2. Thus, like reference numerals refer to like elements, and in a material and a structure of each element, the same or similar descriptions are not repeated.

As seen in FIG. 3, the organic light emitting display apparatus according to an embodiment of the present invention may include an anode electrode 180, an auxiliary electrode 190, a bank 220, a first partition wall 231, a second partition wall 232, and an auxiliary line 300.

The anode electrode 180 may be formed in plurality on a substrate of the organic light emitting display apparatus. A plurality of the auxiliary lines 300 may be respectively formed between the plurality of anode electrodes 180 and arranged in one direction to have a stripe structure.

The auxiliary electrode 190 may be formed on the auxiliary line 300 in a rectangular shape. However, the present embodiment is not limited thereto.

The bank 220 may be formed to overlap a portion of the auxiliary electrode 190.

The first partition wall 231 may be formed at a center portion of the auxiliary electrode 190 to support the second partition wall 232. The first partition wall 231 and the second partition wall 232 may be formed in an island shape on the auxiliary electrode 190 to be separated from the other elements.

A fourth contact hole CH4 may be formed on the auxiliary electrode 190 and may be connected to the auxiliary line 300.

A cathode electrode may be formed without an organic emission layer being formed in a partial region (i.e., a portion of the auxiliary electrode 190 overlapping the second partition wall 232) other than a partial region where the first partition wall 231 is formed, in a region of the auxiliary electrode 190 corresponding to the second partition wall 232. Thus, the auxiliary electrode 190 may be electrically connected to the cathode electrode.

As described above, if the second partition wall 232 is formed, a top of the second partition wall 232 may act as eaves in depositing the organic emission layer, and thus, because the organic emission layer is not deposited under the eaves, a mask pattern which covers a top of the auxiliary electrode 190 is not needed.

However, a width of a top of the second partition wall 232 may be formed greater than that of a bottom of the second partition wall 232, and because the first partition wall 231 is formed under the second partition wall 232 according to a size of the bottom of the second partition wall 232, the first partition wall 231 may unstably support the second partition wall 232. Due to such a problem, if the first partition wall 231 cannot support the second partition wall 232, the top of the second partition wall 232, acting as eaves, may not cover a separation space between the partition wall and the bank 220, and for this reason, the organic emission layer may penetrate into the separation space between the partition wall and the bank 220. Therefore, the auxiliary electrode 190 may not be exposed, causing a defect where the cathode electrode cannot be electrically connected to the auxiliary electrode 190. Also, when a total size of the auxiliary electrode 190 increases for forming the second partition wall 232 with a stable size, a size of the anode electrode 180 formed on the same layer as a layer on which the auxiliary electrode 190 is disposed may be reduced, causing a reduction in an aperture ratio.

Figure 4:
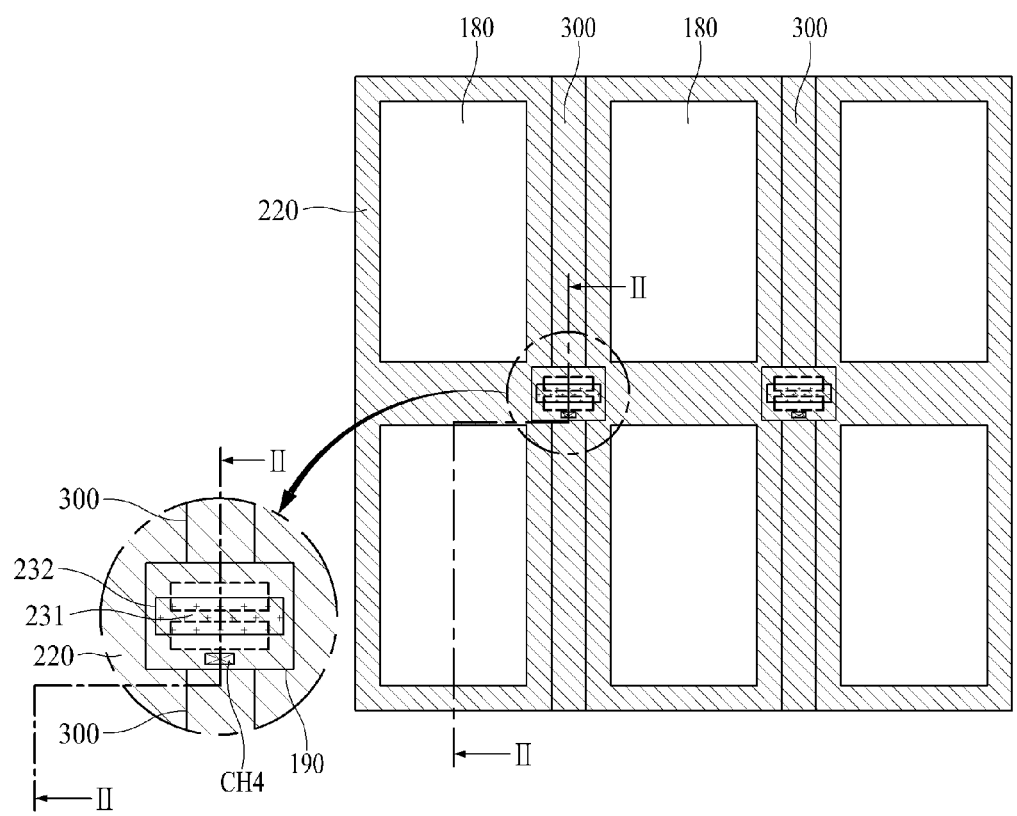
FIG. 4 is a plan view of an organic light emitting display apparatus according to another example embodiment of the present invention.

FIG. 4 is a plan view of an organic light emitting display apparatus according to another example embodiment of the present invention.

FIG. 4 illustrates a plan view of the above-described organic light emitting display apparatus of FIG. 2. Thus, like reference numerals refer to like elements, and in a material and a structure of each element, the same or similar descriptions are not repeated.

As seen in FIG. 4, the organic light emitting display apparatus may include an anode electrode 180, an auxiliary electrode 190, a bank 220, a first partition wall 231, a second partition wall 232, and an auxiliary line 300. Elements other than the first partition wall 231 and the second partition wall 232 may be the same as those of the above-described organic light emitting display apparatus of FIG. 3, and thus, their detailed descriptions are not repeated.

The first partition wall 231 of the organic light emitting display apparatus of FIG. 3 is formed in an island shape on the auxiliary electrode 190 to be separated from the other elements. On the other hand, both ends of the first partition wall 231 of the organic light emitting display apparatus according to another example embodiment of the present invention may contact the bank 220. Therefore, according to another example embodiment, the first partition wall 231 may not be formed in an island shape on the auxiliary electrode 190 to be separated from the other elements, but may be formed to contact the bank 220, and thus, the first partition wall 231 may stably support the second partition wall 232.

Moreover, the second partition wall 232 of the organic light emitting display apparatus of FIG. 3 may be formed on a top of the first partition wall 231 to be supported by only the first partition wall 231. On the other hand, the second partition wall 232 of the organic light emitting display apparatus according to another example embodiment of the present invention may be formed to contact the bank 220, and the partition wall 231 may be formed on the same layer as a layer on which the bank 220 is disposed, whereby the second partition wall 232 is more stably supported by the first partition wall 231 and the bank 220. For this reason, a defect where the cathode electrode cannot electrically be connected to the auxiliary electrode 190 may be prevented. Also, the second partition wall 232 may be stably formed even without any increase in a total size of the auxiliary electrode 190, and thus may not affect a size of the anode electrode 180 which is formed on the same layer as a layer thereof, thereby preventing an aperture ratio from being reduced.

The first partition wall 231 may include a portion contacting the bank 220 and another portion which does not contact the bank 220. The auxiliary electrode 190 may be formed to be exposed in a region between the bank 220 and the other portion of the first partition wall 231 which does not contact the bank 220. Therefore, the exposed auxiliary electrode 190 may be electrically connected to the cathode electrode, thereby lowering a resistance.

An organic emission layer may not be formed in an exposed region of the auxiliary electrode 190, where the first partition wall 231 and the bank 220 are not formed. Accordingly, the cathode electrode may be electrically connected to the auxiliary electrode 190 in the exposed region of the auxiliary electrode 190.

Figure 5:
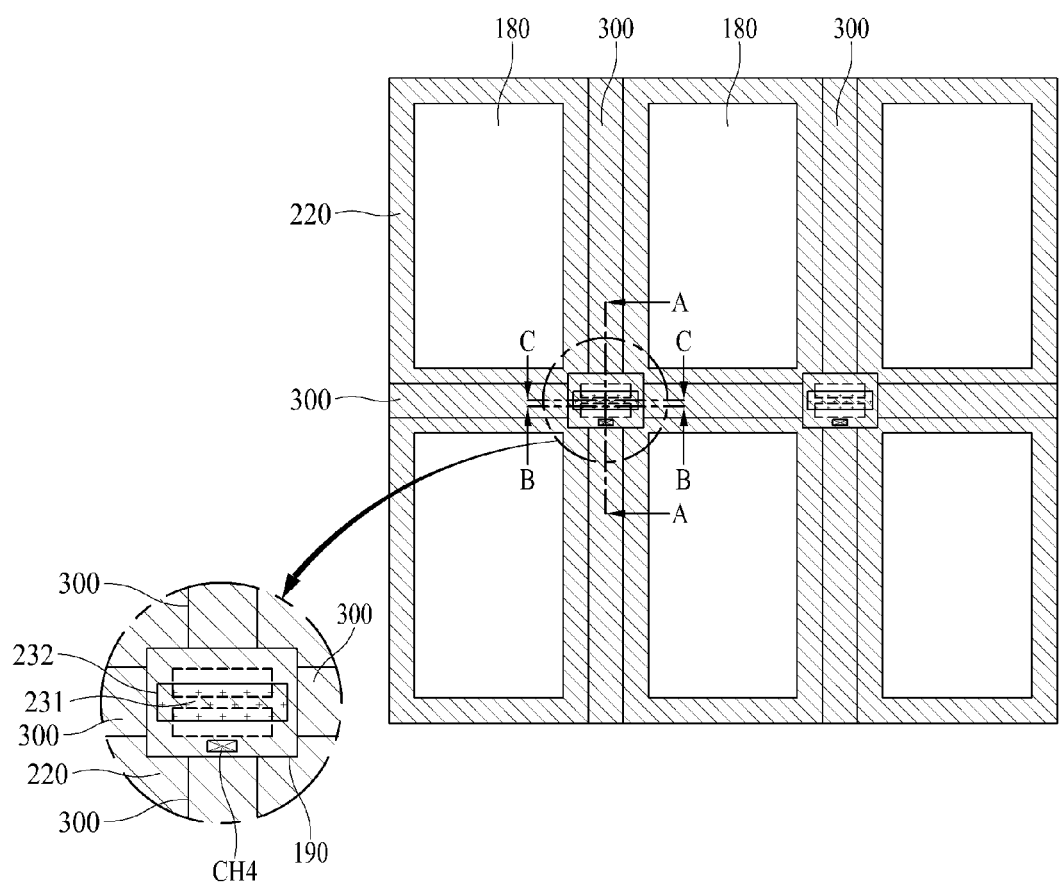
FIG. 5 is a plan view of an organic light emitting display apparatus according to another example embodiment of the present invention.

FIG. 5 is a plan view of an organic light emitting display apparatus according to another example embodiment of the present invention.

FIG. 5 illustrates a plan view of the above-described organic light emitting display apparatus of FIG. 2. Thus, like reference numerals refer to like elements, and in a material and a structure of each element, the same or similar descriptions are not repeated.

As seen in FIG. 5, the organic light emitting display apparatus may include an anode electrode 180, an auxiliary electrode 190, a bank 220, a first partition wall 231, a second partition wall 232, and an auxiliary line 300. Elements other than the auxiliary line 300 may be the same as those of the above-described organic light emitting display apparatus of FIG. 4, and thus, their detailed descriptions are not repeated.

The auxiliary lines 300 of the organic light emitting display apparatus of FIG. 4 are respectively formed between the plurality of anode electrodes 180 and arranged in one direction to have the stripe structure. On the other hand, in the organic light emitting display apparatus according to the example embodiment of FIG. 5, a plurality of the auxiliary lines 300 may be formed in a mesh structure where the plurality of auxiliary lines 300 are arranged to intersect each other between a plurality of the anode electrodes 180. Therefore, an area of each of the auxiliary lines 300 is larger in a case where the auxiliary lines 300 are formed in the mesh structure, than in a case where the auxiliary lines 300 are formed in the stripe structure, and thus, a resistance of the organic light emitting display apparatus according to another example embodiment of the present invention may be further reduced.

The auxiliary electrode 190 may be formed at a portion where the auxiliary lines 300 intersect each other.

Figure 6A:
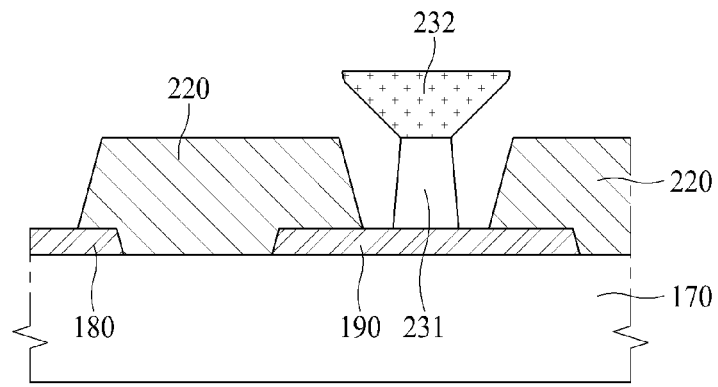
FIGS. 6A to 6C are cross-sectional views of an organic light emitting display apparatus according to another example embodiment of the present invention.
Figure 6B:
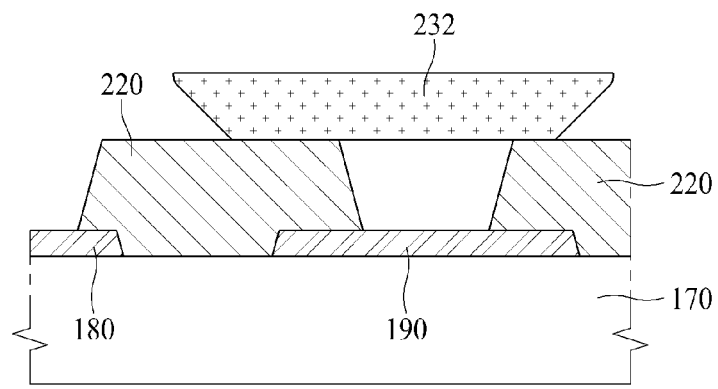
Figure 6C:
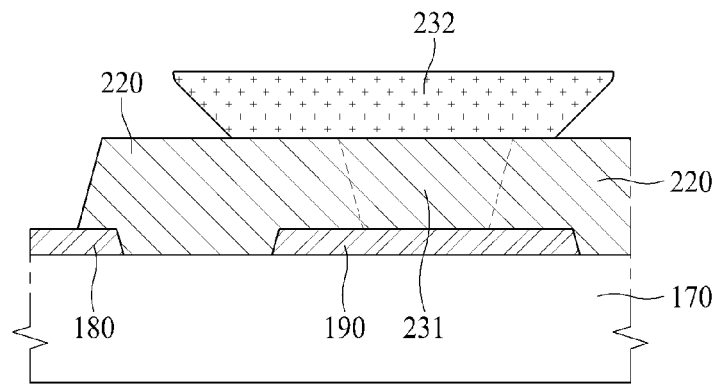

FIGS. 6A to 6C are cross-sectional views of an organic light emitting display apparatus according to another example embodiment of the present invention, and illustrate a cross-sectional view of the above-described auxiliary electrode of FIG. 5. Thus, like reference numerals refer to like elements, and in a material and a structure of each element, the same or similar descriptions are not repeated.

FIG. 6A illustrates a cross-sectional surface taken along line A-A of FIG. 5. As seen in FIG. 6A, the anode electrode 180 and the auxiliary electrode 190 may be formed on a planarization layer 170 to be separated from each other. The bank 220 may be formed between the anode electrode 180 and the auxiliary electrode 190, and may insulate the anode electrode 180 from the auxiliary electrode 190. The first partition wall 231 may be formed in an island shape on an exposed portion of a top of the auxiliary electrode 190, and the second partition wall 232 may be formed on a top of the first partition wall 231.

FIG. 6B illustrates a cross-sectional surface taken along line B-B of FIG. 5. As seen in FIG. 6B, the anode electrode 180, the auxiliary electrode 190, and the bank 220 may be formed on the planarization layer 170. Because line B-B is located in a region which is exposed without the first partition wall 231 being formed in the auxiliary electrode 190, the first partition wall 231 is not illustrated. Both ends of the second partition wall 232 may be formed to contact the bank 220.

FIG. 6C illustrates a cross-sectional surface taken along line C-C of FIG. 5. As seen in FIG. 6C, the anode electrode 180, the auxiliary electrode 190, and the bank 220 may be formed on the planarization layer 170. The first partition wall 231 may extend and may be connected to the bank 220, and the second partition wall 232 may be formed to be supported by the first partition wall 231 and the bank 220.

Figure 7:
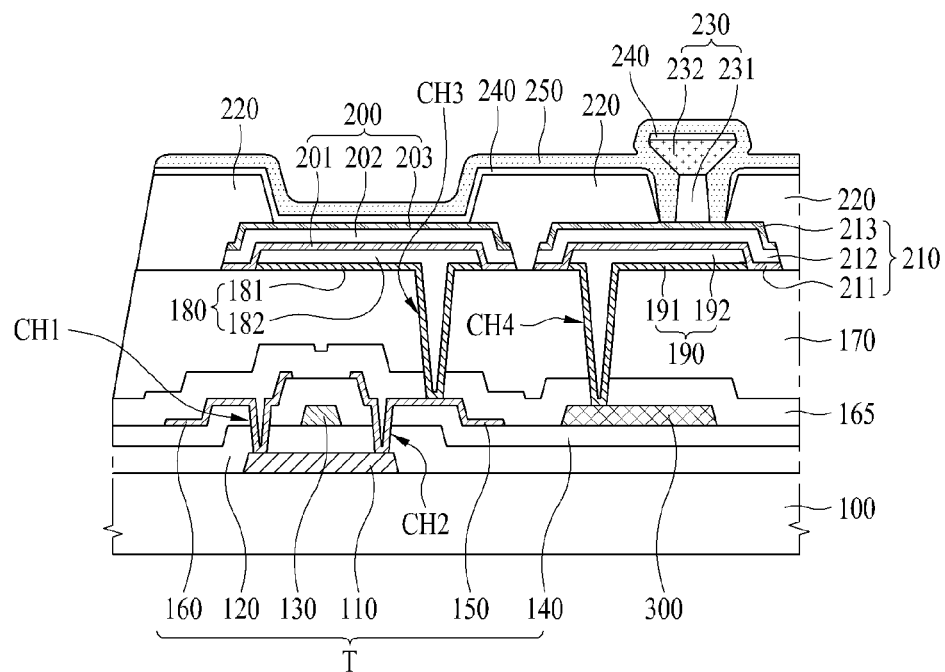
FIG. 7 is a cross-sectional view of an organic light emitting display apparatus according to another example embodiment of the present invention.

FIG. 7 is a cross-sectional view of an organic light emitting display apparatus according to another example embodiment of the present invention.

Except for a first anode electrode 180, a second anode electrode 200, a first auxiliary electrode 190, and a second auxiliary electrode 210, the organic light emitting display apparatus of FIG. 7 may be the same as the above-described organic light emitting display apparatus of FIG. 2, and thus, repetitive descriptions are not provided.

The first anode electrode 180 and the first auxiliary electrode 190 may be formed on the planarization layer 170. That is, the first anode electrode 180 and the first auxiliary electrode 190 may be formed on the same layer. A third contact hole CH3 exposing the source electrode 150 may be included in the above-described passivation layer 165 and planarization layer 170, and the source electrode 150 may be connected to the first anode electrode 180 through the third contact hole CH3.

The first anode electrode 180 may include a first lower anode electrode 181 and a first upper anode electrode 182.

The first lower anode electrode 181 may be formed between the planarization layer 170 and the first upper anode electrode 182, and may enhance an adhesive force between the planarization layer 170 and the first upper anode electrode 182. Also, the first lower anode electrode 181 may protect a bottom of the first upper anode electrode 182, thereby preventing the bottom of the first upper anode electrode 182 from being corroded.

The first upper anode electrode 182 may be formed on a top of the first lower anode electrode 181. The first upper anode electrode 182 may be formed of metal which is relatively lower in resistance than the first lower anode electrode 181.

Similarly to the above-described first anode electrode 180, the first auxiliary electrode 190 may include a first lower auxiliary electrode 191 and a second upper auxiliary electrode 192.

The first lower auxiliary electrode 191 may be formed between the planarization layer 170 and the first upper auxiliary electrode 192. The first lower auxiliary electrode 191 may enhance an adhesive force between the planarization layer 170 and the first upper auxiliary electrode 192, and may prevent a bottom of the first upper auxiliary electrode 192 from being corroded.

The first upper auxiliary electrode 192 may be formed of low-resistance metal on a top of the first lower auxiliary electrode 191.

The second anode electrode 200 may be formed to cover a top and a side surface of the first anode electrode 180, thereby preventing the top and side surfaces of the first anode electrode 180 from being corroded.

The second anode electrode 200 may include a second lower anode electrode 201, a second center anode electrode 202, and a second upper anode electrode 203.

The second lower anode electrode 201 may be formed between the first anode electrode 180 and the second center anode electrode 202. The second lower anode electrode 201 may be formed to cover the top and side surface of the first anode electrode 180, thereby preventing the first anode electrode 180 from being corroded.

The second center anode electrode 202 may be formed between the second lower anode electrode 201 and the second upper anode electrode 203. The second center anode electrode 202 may be formed of a material which is lower in resistance than, and better in reflectivity than, the second lower anode electrode 201 and the second upper anode electrode 203.

The second upper anode electrode 203 may be formed on a top of the second center anode electrode 202, thereby preventing the top of the second center anode electrode 202 from being corroded.

The second auxiliary electrode 210 may be formed on a top of the first auxiliary electrode 190. The second auxiliary electrode 210 may be formed on the same layer as a layer on which the second anode electrode 200 is disposed. The second auxiliary electrode 210 may be formed to cover a top and a side surface of the first auxiliary electrode 190, thereby preventing the top and side surfaces of the first auxiliary electrode 190 from being corroded. The second auxiliary electrode 210 may lower a resistance of the cathode electrode 250 along with the first auxiliary electrode 190.

The second auxiliary electrode 210 may include a second lower auxiliary electrode 211, a second center auxiliary electrode 212, and a second upper auxiliary electrode 213.

The second lower auxiliary electrode 211 may be formed between the first auxiliary electrode 190 and the second center auxiliary electrode 212. The second lower auxiliary electrode 211 may be formed to cover the top and side surfaces of the first auxiliary electrode 190, thereby preventing the first auxiliary electrode 190 from being corroded.

The second center auxiliary electrode 212 may be formed between the second lower auxiliary electrode 211 and the second upper auxiliary electrode 213. The second center auxiliary electrode 212 may be formed of a material that is lower in resistance than, and better in reflectivity than, the second lower auxiliary electrode 211 and the second upper auxiliary electrode 213.

The second upper auxiliary electrode 213 may be formed on a top of the second center auxiliary electrode 212, thereby preventing the top of the second center auxiliary electrode 212 from being corroded.

Figure 8:
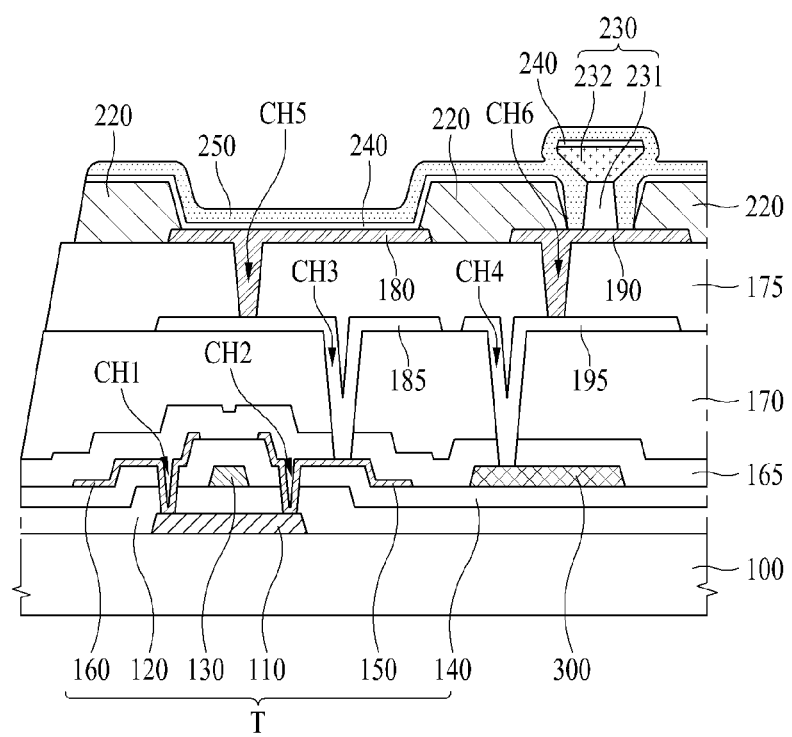
FIG. 8 is a cross-sectional view of an organic light emitting display apparatus according to another example embodiment of the present invention.

FIG. 8 is a cross-sectional view of an organic light emitting display apparatus according to another example embodiment of the present invention.

Except for a first connection line 185, a second connection line 195, and a second planarization layer 175, the organic light emitting display apparatus of FIG. 8 may be the same as the above-described organic light emitting display apparatus of FIG. 2, and thus, repetitive descriptions are not provided.

In the above-described organic light emitting display apparatus of FIG. 7, the second anode electrode 200 and the second auxiliary electrode 210 are respectively formed on the first anode electrode 180 and the first auxiliary electrode 190, and thus, resistances of the anode electrode 180 and the cathode electrode 250 may be lowered. However, because the auxiliary electrode 190 and the anode electrode 180 are formed on the same layer, a space for forming the anode electrode 180 and the auxiliary electrode 190 may be limited. In contrast, in the organic light emitting display apparatus of FIG. 8 according to another example embodiment, the first connection line 185 connected to the anode electrode 180 may be formed under the anode electrode 180, and the second connection line 195 connected to the auxil-iary electrode 190 may be formed under the auxiliary electrode 190. The anode electrode 180 and the auxiliary electrode 190 are respectively connected to the first connection line 185 and the second connection line 195, and thus may be broad in area. Accordingly, resistances of the anode electrode 180 and the cathode electrode 250 may be further reduced.

The first connection line 185 and the second connection line 195 may be formed on the first planarization layer 170. That is, the first connection line 185 and the second connection line 195 may be formed on the same layer to be separated from each other. A third contact hole CH3 exposing the source electrode 150 may be included in the passivation layer 165 and the first planarization layer 170, and the source electrode 150 may be connected to the first connection line 185 through the third contact hole CH3. Also, a fourth contact hole CH4 exposing the auxiliary line 300 may be included in the passivation layer 165 and the first planarization layer 170, and the auxiliary line 300 may be connected to the second connection line 195 through the fourth contact hole CH4.

The second planarization layer 175 may be formed on the first and second connection lines 185 and 195. The anode electrode 180 and the auxiliary electrode 190 may be formed on the second planarization layer 175. A fifth contact hole CH5 exposing the first connection line 185 may be included in the second planarization layer 175, and the first connection line 185 may be connected to the anode electrode 180 through the fifth contact hole CH5. That is, the anode electrode 180 may be connected to the source electrode 150 through the first connection line 185. Also, a sixth contact hole CH6 exposing the second connection line 195 may be included in the second planarization layer 175, and the second connection line 195 may be connected to the auxiliary electrode 190 through the sixth contact hole CH6. That is, the auxiliary electrode 190 may be connected to the auxiliary line 300 through the second connection line 195.

As described above, according to example embodiments of the present invention, the partition wall may be stably formed in the existing size of the auxiliary electrode without reduction in an aperture ratio.

Moreover, according to example embodiments of the present invention, the organic emission layer may be formed without a mask pattern covering a top of the auxiliary electrode, and thus, an increase in the complexity or time for the mask process may be prevented.

Moreover, according to example embodiments of the present invention, the first partition wall may stably support the second partition wall, thereby preventing a defect.

Moreover, according to example embodiments of the present invention, two anode electrodes (for example, the first and second anode electrodes) may be stack-formed for lowering the resistance of the anode electrode, and thus, the desired resistance characteristic of the anode electrode may be more easily obtained.

Moreover, according to example embodiments of the present invention, two auxiliary electrodes (for example, the first and second auxiliary electrodes) may be stack-formed for lowering the resistance of the cathode electrode, and thus, the desired resistance characteristic of the auxiliary electrode may be more easily obtained.

Moreover, according to example embodiments of the present invention, the auxiliary line may be connected to the auxiliary electrode by the connection line, and thus, the desired resistance characteristic of the auxiliary electrode may be more easily obtained.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. An organic light emitting display apparatus, comprising:
   a substrate;
   an anode electrode on the substrate;
   an auxiliary electrode on the substrate;
   an organic emission layer on the anode electrode;
   a cathode electrode on the organic emission layer and on the auxiliary electrode;
   an insulating bank on the auxiliary electrode, the bank overlapping a first portion of the auxiliary electrode and exposing a second portion of the auxiliary electrode;
   a first partition wall on the auxiliary electrode;
   a second partition wall on the first partition wall and covering the exposed second portion of the auxiliary electrode in plan view,
   wherein a separation space is between the second partition wall and the bank;
   the cathode electrode is electrically connected to the auxiliary electrode through the separation space between the second partition wall and the bank; and
   the second partition wall is supported by the first partition wall and the bank.

2. The organic light emitting display apparatus according to claim 1, wherein two opposite sides of the first partition wall contact the bank.

3. The organic light emitting display apparatus according to claim 2, wherein:
   the first partition wall includes a portion that does not contact the bank; and
   the second portion of the auxiliary electrode is exposed in a region between the bank and the portion of the first partition wall that does not contact the bank.

4. The organic light emitting display apparatus of claim 3, wherein the cathode electrode is connected to the second portion of the auxiliary electrode that is exposed in the region between the bank and the portion of the first partition wall that does not contact the bank.

5. The organic light emitting display apparatus according to claim 1, wherein the cathode electrode is connected to the second portion of the auxiliary electrode that overlaps with the second partition wall in plan view.

6. The organic light emitting display apparatus according to claim 1, wherein the first partition wall is on the same layer as the bank.

7. The organic light emitting display apparatus according to claim 1, further comprising:
   an auxiliary line between a plurality of the anode electrodes, the auxiliary line connected to the auxiliary electrode through a contact hole.

8. The organic light emitting display apparatus according to claim 7, wherein:
   the auxiliary line has a stripe structure wherein a plurality of the auxiliary lines are arranged in one direction, or a mesh structure wherein a plurality of auxiliary lines are arranged in two directions to intersect each other.

9. The organic light emitting display apparatus according to claim 7, further comprising:
   a thin film transistor on the substrate, the thin film transistor including a source electrode,
   wherein the auxiliary line is on the same layer as the source electrode.

10. The organic light emitting display apparatus according to claim 7, wherein the contact hole which connects the auxiliary electrode to the auxiliary line does not overlap the first partition wall in plan view.

11. The organic light emitting display apparatus according to claim 1, wherein:
    the anode electrode includes a first anode electrode and a second anode electrode, the second anode electrode covering a top surface and a side surface of the first anode electrode; and
    the auxiliary electrode includes a first auxiliary electrode and a second auxiliary electrode, the second auxiliary electrode covering a top surface and a side surface of the first auxiliary electrode.

12. The organic light emitting display apparatus according to claim 1, further comprising:
    an auxiliary line; and
    a connection line on the auxiliary line and connected to the auxiliary line, the connection line connected to the auxiliary electrode.

13. The organic light emitting display apparatus according to claim 1, wherein the auxiliary electrode is on the same layer as the anode electrode.

* * * * *